United States Patent
Cheng et al.

(10) Patent No.: US 11,089,408 B2
(45) Date of Patent: Aug. 10, 2021

(54) MEMS MICROPHONE HAVING DIAPHRAGM

(71) Applicant: Taiwan Semiconductor Manufacturing Co., Ltd., Hsin-Chu (TW)

(72) Inventors: Chun-Wen Cheng, Zhubei (TW); Chia-Hua Chu, Zhubei (TW); Chun Yin Tsai, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/907,657

(22) Filed: Jun. 22, 2020

(65) Prior Publication Data
US 2020/0322733 A1 Oct. 8, 2020

Related U.S. Application Data

(62) Division of application No. 16/016,996, filed on Jun. 25, 2018, now Pat. No. 10,715,924.

(51) Int. Cl.
*H04R 19/04* (2006.01)
*H04R 19/00* (2006.01)
*H04R 31/00* (2006.01)

(52) U.S. Cl.
CPC ........... *H04R 19/04* (2013.01); *H04R 19/005* (2013.01); *H04R 31/00* (2013.01);
(Continued)

(58) Field of Classification Search
CPC .... H04R 19/005; H04R 19/016; H04R 19/04; H04R 2201/003
See application file for complete search history.

(56) References Cited

U.S. PATENT DOCUMENTS

| | | | | |
|---|---|---|---|---|
| 8,135,150 B2 * | 3/2012 | Izuchi | ................. | H04R 19/016 381/174 |
| 8,942,394 B2 * | 1/2015 | Conti | ...................... | H04R 7/24 381/174 |
| 8,975,107 B2 * | 3/2015 | Dehe | ..................... | H04R 19/04 438/53 |

(Continued)

FOREIGN PATENT DOCUMENTS

| | | | |
|---|---|---|---|
| CN | 104980858 A | 10/2015 | |
| CN | 206365042 U | 7/2017 | |

(Continued)

OTHER PUBLICATIONS

Non-Final Office Action dated Nov. 19, 2019 for U.S. Appl. No. 16/016,996.
(Continued)

*Primary Examiner* — Ryan Robinson
(74) *Attorney, Agent, or Firm* — Eschweiler & Potashnik, LLC

(57) ABSTRACT

A MEMS microphone includes a backplate that has a plurality of open areas, and a diaphragm spaced apart from the backplate. The diaphragm is deformable by sound waves to cause gaps between the backplate and the diaphragm being changed at multiple locations on the diaphragm. The diaphragm includes a plurality of anchor areas, located near a boundary of the diaphragm, which is fixed relative to the backplate. The diaphragm also includes multiple vent valves. Examples of the vent valve include a wing vent valve and a vortex vent valve.

20 Claims, 14 Drawing Sheets

(52) U.S. Cl.
CPC ............. *B81B 2201/0257* (2013.01); *B81B 2203/0127* (2013.01); *H04R 2201/003* (2013.01)

(56) References Cited

U.S. PATENT DOCUMENTS

| | | | | |
|---|---|---|---|---|
| 9,002,037 B2* | 4/2015 | Dehe | ............ | B81B 7/0029 |
| | | | | 381/113 |
| 9,409,763 B2* | 8/2016 | Dehe | ............ | H04R 19/005 |
| 9,521,491 B2* | 12/2016 | Inoue | ............ | B81B 7/0006 |
| 9,681,243 B2* | 6/2017 | Guo | ............ | B81B 3/0051 |
| 9,695,038 B2* | 7/2017 | Cargill | ............ | H04R 19/005 |
| 9,914,636 B2* | 3/2018 | Buck | ............ | B81B 3/0072 |
| 9,936,306 B1* | 4/2018 | Zhang | ............ | B81B 7/0029 |
| 9,991,822 B2* | 6/2018 | Rombach | ............ | H02N 1/08 |
| 10,154,525 B2 | 12/2018 | Kuo et al. | | |
| 10,266,393 B2* | 4/2019 | Chung | ............ | G01L 9/0042 |
| 10,273,150 B2 | 4/2019 | Sun | | |
| 10,327,007 B2 | 6/2019 | Terada et al. | | |
| 10,327,077 B2* | 6/2019 | Yoo | ............ | B81B 3/0037 |
| 10,343,901 B2* | 7/2019 | Cargill | ............ | B81B 3/0037 |
| 10,349,186 B2* | 7/2019 | Zhan | ............ | H04R 19/005 |
| 10,367,430 B2* | 7/2019 | Tumpold | ............ | H04R 19/005 |
| 10,375,483 B2* | 8/2019 | Cargill | ............ | H04R 19/04 |
| | | | | 438/53 |
| 2014/0084395 A1* | 3/2014 | Sparks | ............ | G01L 9/008 |
| | | | | 257/416 |
| 2016/0176704 A1 | 6/2016 | Cargill et al. | | |
| 2017/0247248 A1 | 8/2017 | Hoekstra | | |
| 2019/0230439 A1 | 7/2019 | Zhan et al. | | |

FOREIGN PATENT DOCUMENTS

| | | |
|---|---|---|
| CN | 106996827 A | 8/2017 |
| CN | 206908856 U | 1/2018 |
| EP | 1748287 A1 | 1/2007 |
| WO | 2007010421 A2 | 1/2007 |

OTHER PUBLICATIONS

Notice of Allowance dated Mar. 5, 2020 for U.S. Appl. No. 16/016,996.

* cited by examiner

Venting Hole
55

Air Blow

MEMS MICROPHONE HAVING DIAPHRAGM

REFERENCE TO RELATED APPLICATION

This application is a Divisional of U.S. application Ser. No. 16/016,996, filed on Jun. 25, 2018, the contents of which are hereby incorporated by reference in their entirety.

BACKGROUND

A MEMS microphone generally includes a capacitive element formed with a backplate and a diaphragm spaced apart from the backplate. With the MEMS microphone, sound waves can be converted to electrical signals by sensing the capacitance of the capacitive element when the diaphragm is deformed by energy of the sound waves.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
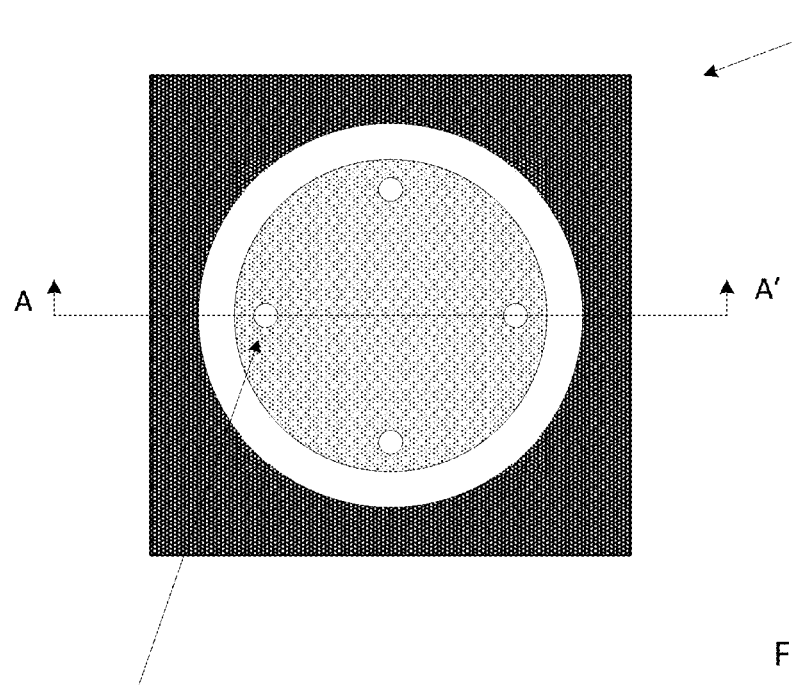
FIG. 1A is a top view of a diaphragm in a MEMS microphone.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
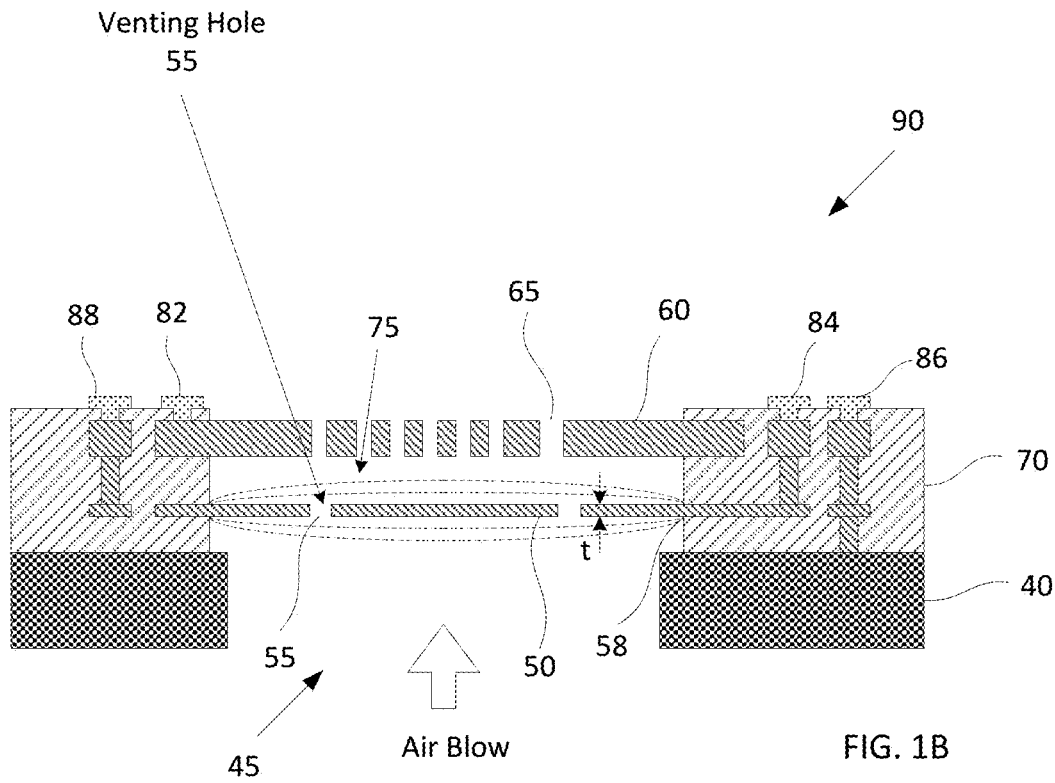
FIG. 1B is a cross-sectional views showing a MEMS microphone that is fabricated on a substrate.

Many micro-electromechanical system (MEMS) device scan be manufactured using semiconductor device fabrication methods. Examples of these MEMS devices include MEMS microphones, such as, a MEMS microphone 90 as illustrated in FIGS. 1A-1B. FIG. 1B is a cross-sectional view showing a MEMS microphone 90 that is fabricated on a substrate 40. The MEMS microphone 90 includes a backplate 60 and a diaphragm 50 spaced apart from the backplate 60. Both the backplate 60 and the diaphragm 50 can be electrically conductive, which form a capacitive element. An electrical contact 82 electrically connected to the backplate 60 forms a first terminal for the capacitive element, and an electrical contact 84 electrically connected to the diaphragm 50 forms a second terminal for the capacitive element.

FIG. 1A is a top view of the diaphragm 50 of the MEMS microphone 90 in FIG. 1B. The cross section A-A' of the diaphragm 50 is illustrated in FIG. 1B. The diaphragm 50 includes multiple venting holes 55 distributed on the diaphragm 50 (e.g., venting holes as shown or more). The diaphragm 50 also includes one or more anchor areas 58 located near a boundary of the diaphragm 50. The anchor areas 58 allow the boundary of the diaphragm 50 to be fixed relative to the backplate 60 and allow gaps between the diaphragm and the backplate to be changed at the center of the diaphragm 50 and at other locations on the diaphragm at some distance away from the anchor areas 58. The diaphragm 50 is deformable by energy of sound waves to make the diaphragm 50 bend towards or away from the backplate 60, as the sound waves exert pressures on the diaphragm 50 through an opening 45 in the substrate 40. The backplate 60 has multiple open areas 65. There is an air volume space 75 between the diaphragm 50 and the backplate 60. Air can get out of or get into the air volume space 75 through the air passages formed by the open areas 65 on the backplate 60 and/or by the venting holes 55 on the the diaphragm 50, as the diaphragm 50 bends towards or away from the backplate 60.

The bending movement of the diaphragm 50 relative to the backplate 60 caused by the sound waves changes the capacitance of the capacitive element between the diaphragm 50 and the backplate 60. Such change of the capacitance can be measured with the electrical contact 82 and the electrical contact 84. For the same amount of air pressure exerted on the diaphragm 50 by the sound waves, if the rigidity of the diaphragm 50 decreases, the amount of the bend of the diaphragm 50 caused by the sound waves increases and the induced change of the capacitance increases as well. That is, decreasing the rigidity of the diaphragm 50 improves the sensitivity of the MEMS microphone 90. The rigidity of the diaphragm 50 can be decreased by selecting the material for making the diaphragm or by decreasing the thickness ("t" as shown in FIG. 1B) of the diaphragm.

The diaphragm 50 in the MEMS microphone 90 generally has to withstand an air blow test. For example, when the air pressure exerted on the diaphragm 50 by the air blow test is at about 0.2 MPa, the chance of getting the diaphragm 50 broken should be statistically negligible under accepted statistical standard. While increasing the rigidity of the diaphragm 50 can decrease the chance of breaking the diaphragm 50, such increasing of the rigidity also lowers the sensitivity of the MEMS microphone 90. In an alternative method, increasing the size of the venting holes 55 and/or increasing the total number of the venting holes 55 to increase overall open ratio can also decrease the chance of breaking the diaphragm 50. But such measure of increasing open ratio also lowers the sensitivity of the MEMS microphone 90, because such measure also lowers the sensing area. Furthermore, increasing open ratio may also increase the low corner frequency of the MEMS microphone 90, making it less sensitive to low frequency sound waves. It is desirable to have an improved structure of the diaphragm that has improved chance of surviving air blow tests without losing the sensitivity of the MEMS microphone.

Figure 2A:
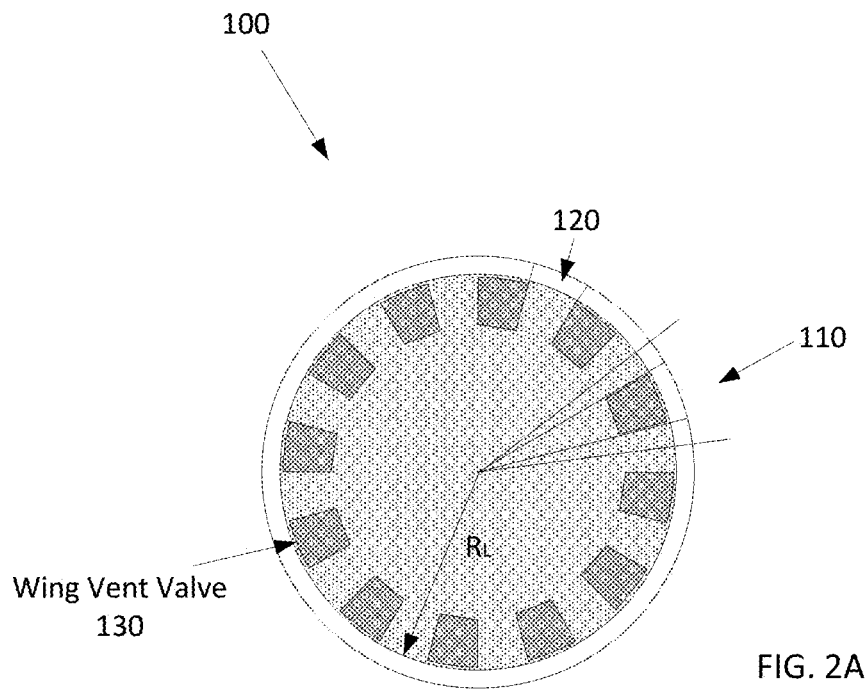
FIG. 2A is a top view of a diaphragm having wing vent valves for using in a MEMS microphone in accordance with some embodiments.
Figure 2B:
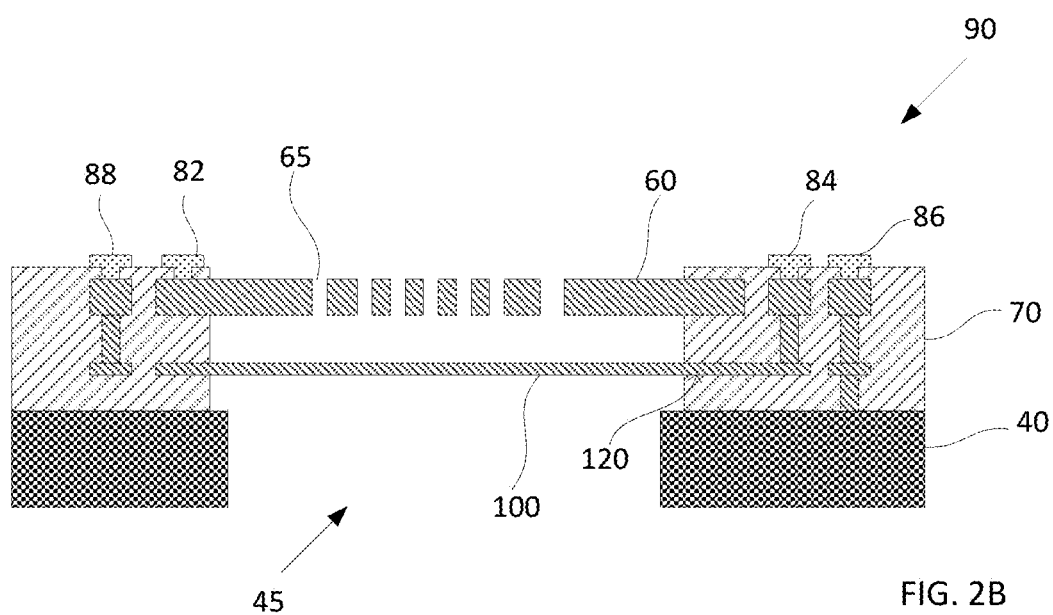
FIG. 2B is a cross-sectional view showing a MEMS microphone having a diaphragm with wing vent valves in accordance with some embodiments.
Figure 2C:
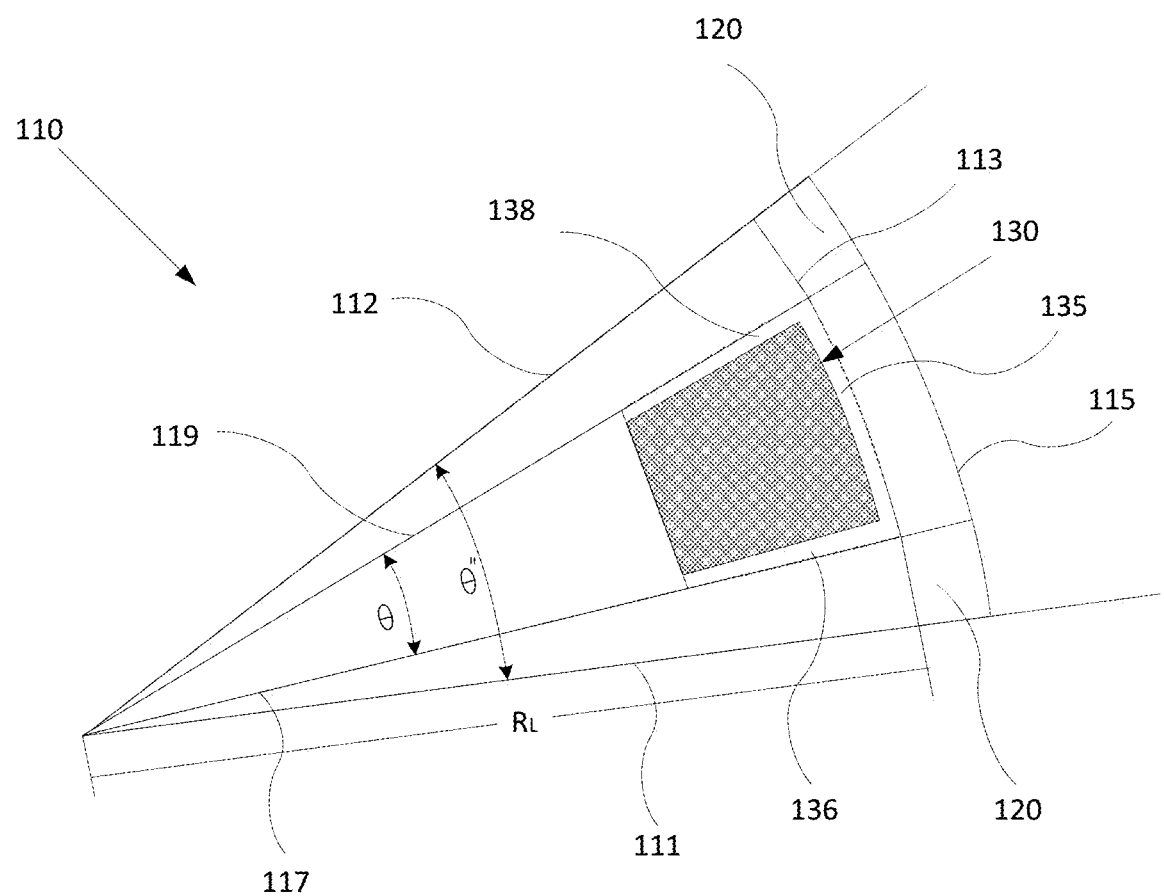
FIG. 2C is a top view of one of the sectors having a wing vent valve in accordance with some embodiments.

FIGS. 2A-2C illustrate the structure of a diaphragm having wing vent valves for using in a MEMS microphone in accordance with some embodiments. As shown in FIG. 2B, a MEMS microphone 90 includes a backplate 60 and a diaphragm 100 constructed on a substrate 40. The backplate 60 has multiple open areas 65. The diaphragm 100 is spaced apart from the backplate 60 and deformable by energy of sound waves to cause gaps between the backplate 60 and the diaphragm 100 being changed at multiple locations on the diaphragm. For example, the diaphragm 100 can be bent away or bent towards the backplate 60. In many situations, when the diaphragm 100 is bent, the gap change between the backplate 60 and the diaphragm 100 at a first location near the center of the diaphragm 100 is often large than the gap change between the backplate 60 and the diaphragm 100 at a second location near the boundary of the diaphragm 100, if the above mentioned first location and second location are located on a same radius line on the diaphragm 100. In the embodiments as shown in FIGS. 2A-2C, there are also multiple anchor areas 120 located near the boundary of the diaphragm 100. The parts of the diaphragm in the anchor areas 120 are fixed relative to the backplate 60. That is, the gap between the backplate 60 and the diaphragm 100 at locations in the anchor areas 120 does not change when the diaphragm 100 is bent by sound waves.

In the embodiments as shown in FIGS. 2A-2C, the diaphragm 100 includes multiple sectors 110. As shown in FIG. 2C, the sector 110 is within three boundary segments: an arc 113 and two boundary radius 111 and 112. On the diaphragm 100, the arc 113 is positioned between neighboring anchor areas 120 and within a boundary 115 of the diaphragm 100. The sector 110 includes a wing vent valve 130. The wing vent valve 130 includes a first vent slot 136 extending along a first radius 117, a second vent slot 138 extending along a second radius 119, and a third vent slot 135 joining the first vent slot 136 and the second vent slot 138. Each of the three vent slots 136, 138, and 135 on the diaphragm 100 is a slot opening that allows air to pass through. In some embodiments, the third vent slot 135 is located in an area close to the arc 113 near the boundary of the diaphragm 100. In some embodiments, the third vent slot 135 can be located in an area that is at some distance from the arc 113.

In some embodiments, the third vent slot 135 can join an end of the first vent slot 136 with an end of the second vent slot 138, as shown in FIG. 2C. In some embodiments, the third vent slot 135 can join the first vent slot 136 with the second vent slot 138 at locations other than the ends of the two vent slots 136 and 138. In some embodiments, the third vent slot 135 can extend along an arc 115 within the sector 110, as shown in FIG. 2C. In some embodiments, the third vent slot 135 can join the first vent slot 136 and the second vent slot 138 with a straight line.

As shown in FIGS. 2B-2C, the sector 110 has a radius length $R_l$. In some embodiments, wherein the first vent slot 136 and the second vent slot 138 each have a length that is a fraction of a radius length of the sector 110. In some embodiments, the first vent slot 136 and second vent slot 138 each have a length that is less than one fourth of the radius length $R_l$ of the sector 110. As shown in FIG. 2C, the sector 110 has an angular span θ", and the third vent slot 135 has an angular span θ. In some embodiments, the clamped ratio of the sector 110, (θ"−θ)/θ", is within a range of 10% to 70%. The clamped ratio of the diaphragm 100 can take the form of $(2\pi - \Sigma \theta_i)/2\pi$, where $\Sigma \theta_i$ is the sum of angular spans of the third vent slot in all sectors of the diaphragm 100. In some embodiments, the clamped ratio of the diaphragm 100 is within a range of 10% to 70%. In some embodiments, when all sectors of the diaphragm 100 are substantially identical, the clamped ratio of the diaphragm 100 is substantially the same as the clamped ratio of each sector.

Figure 3:
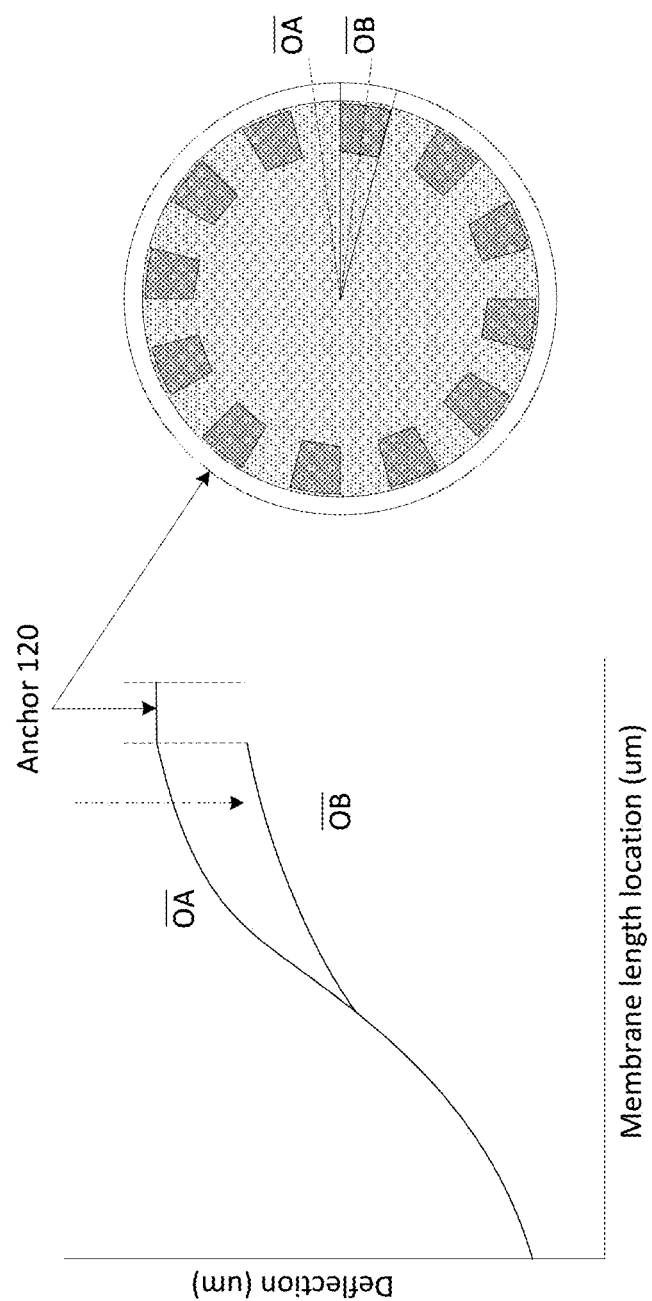
FIG. 3 is a schematic showing the deflection of the diaphragm at multiple locations with improved sensitivity for the MEMS microphone in accordance with some embodiments.

FIG. 3 illustrates a schematic showing the deflection of the diaphragm 100 at multiple locations with improved sensitivity for the MEMS microphone in accordance with some embodiments. In FIG. 3, the deflection of the diaphragm 100 at membrane locations along two representative radii $\overline{OA}$ and $\overline{OB}$ are shown as a function of membrane length ranging from the origin to the edge of the diaphragm 100. The radius $\overline{OA}$ extends in a direction that bypasses the wing vent valve 130. The radius $\overline{OB}$ extends in a direction that passes through the wing vent valve 130. The deflection of the diaphragm 100 at the end of the radius $\overline{OA}$ is fixed and does not depend upon the pressure exerts on the diaphragm 100, because the end of the radius $\overline{OA}$ is anchored in one of the anchor areas.

The difference between the deflection of the diaphragm 100 at the origin and the deflection of the diaphragm 100 at the end of the radius $\overline{OA}$ characterizes the largest gap change between the backplate 60 and the diaphragm 100, which happens at the center location of the diaphragm 100. The gap change between the backplate 60 and the diaphragm 100 at a location along the radius $\overline{OA}$ decreases as such location moves away from the origin and towards the end of the radius $\overline{OA}$. The gap change between the backplate 60 and the diaphragm 100 at a location along the radius $\overline{OB}$ also decreases as such location moves from the origin towards the end of the radius $\overline{OB}$. The gap change at a location along the radius $\overline{OB}$ near the edge areas, however, is significantly larger than the gap change at a location along the radius $\overline{OA}$ near the edge areas, because of the implementation of the wing vent valve 130 on the diaphragm 100. Such larger gap change at locations near the edge areas within the angular span θ of the third vent slot 135 (as shown in FIG. 2C) results in larger capacitive change of the capacitive element formed between the backplate 60 and the diaphragm 100. Consequently, the implementation of the wing vent valve 130 on the diaphragm 100 results in increased sensitivity of the MEMS microphone 90.

Implementing the wing vent valve 130 on the diaphragm 100 not only can increase microphone sensitivity but also can make the diaphragm 100 to pass some common air blow test more easily. In some embodiments, it is possible to select some designs of the diaphragm 100 to make the wing vent valve deflection to stay within a predetermined range. For example, with some designs of the diaphragm 100, deflection of the wing vent valve can be made smaller than 0.1 µm while the air blow pressure is much smaller than 0.2 MPa, and it can be made larger than 0.5 µm while the air blow pressure is much larger than 0.2 MPa. In most of the above motioned selected designs, the first vent slot 136 and second vent slot 138 each have a length that is less than one fourth of a radius length of the sector 110, and the clamped ratio of the sector is within a range of 10% to 70%. Some these selected designs can enhance microphone sensitivity while causing slight rigidity degradation in the diaphragm 100. Additionally, in some embodiments, rigidity degradation in the diaphragm 100 can be compensated by some techniques with some enhanced rigidity in the diaphragm 100. For example, when the diaphragm 100 is subject to an anneal process, it is possible to enhance the rigidity in the diaphragm 100 by increasing 0.1 Mpa to 20 MPa membrane stress induced from the anneal process.

Figure 4A:
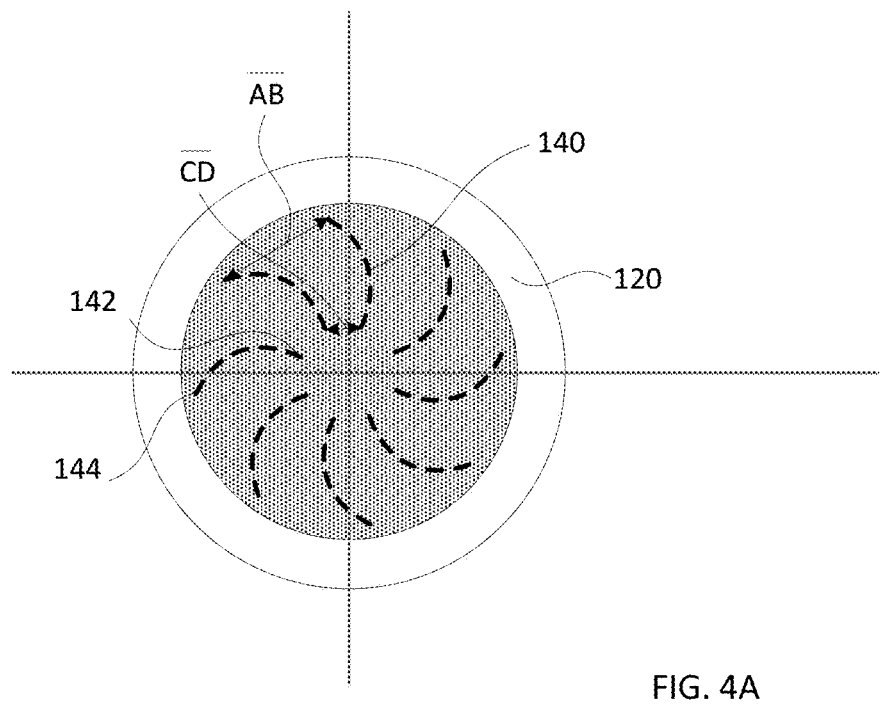
FIG. 4A is a top view of a diaphragm having vortex vent valves for using in a MEMS microphone in accordance with some embodiments.
Figure 4B:
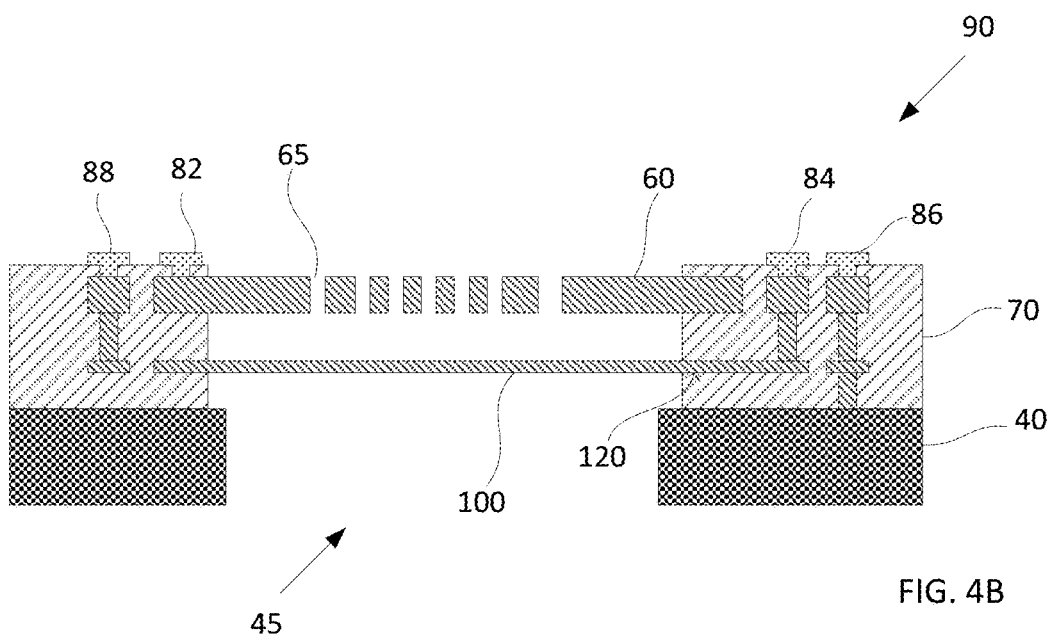
FIG. 4B is a cross-sectional views showing a MEMS microphone having a diaphragm with vortex vent valves in accordance with some embodiments.

In addition to the diaphragm 100 having the wing vent valve 130, there are other embodiments of the diaphragm 100 that can increase microphone sensitivity and pass some common air blow test. FIGS. 4A-4B illustrate the structure of a diaphragm 100 having vortex vent valve 140 for using in a MEMS microphone in accordance with some embodiments. FIG. 4B is a cross-sectional views showing a MEMS microphone 90 having a diaphragm 100 with vortex vent valves 140 in accordance with some embodiments. As shown in FIG. 4B, a MEMS microphone 90 includes a backplate 60 and a diaphragm 100 constructed on a substrate 40. The backplate 60 has multiple open areas 65. The diaphragm 100 is spaced apart from the backplate 60 and deformable by energy of sound waves to cause gaps between the backplate 60 and the diaphragm 100 being changed at multiple locations on the diaphragm. In the embodiments as shown in FIGS. 4A-4B, there are one or more anchor areas 120 located near the boundary of the diaphragm 100 such that the boundary of the diaphragm 100 is fixed relative to the backplate 60. That is, the gap between the backplate 60 and the diaphragm 100 the boundary of the diaphragm 100 does not change when the diaphragm 100 is bent by sound waves.

FIG. 4A is a top view of a diaphragm 100 having vortex vent valves 140 for using in a MEMS microphone 90 in accordance with some embodiments. In FIG. 4A, as illustrated, the shape of each vortex vent valve 140 on the diaphragm 100 is in the form of a curve trench. Each curve trench extending from a first location 142 near a center of the diaphragm to a second location 144 near the boundary of the diaphragm. Mathematically, a curve trench can be represented as r(θ), that is, the radius r of a location on the curve trench is a function of its polar angle θ. In the embodiments as shown in FIG. 4A, a first linear distance between two curve trenches at the first location 142 near the center of the diaphragm is smaller than a second linear distance between the two curve trenches at the second location 144 near the boundary of the diaphragm. For example, as shown in FIG. 4A, the linear distance $\overline{CD}$ is smaller than the linear distance $\overline{AB}$. If the first location near the center of the diaphragm for the two curve trenches is respectively $(r_C, \theta_C)$ and $(r_D, \theta_D)$, and if the second location near the boundary of the diaphragm for the two curve trenches is respectively $(r_A, \theta_A)$ and $(r_B, \theta_B)$, then, $$\sqrt{(r_C\cos\theta_C - r_D\cos\theta_D)^2 + (r_C\sin\theta_C - r_D\sin\theta_D)^2} < \sqrt{(r_A\cos\theta_A - r_B\cos\theta_B)^2 + (r_A\sin\theta_A - r_B\sin\theta_B)^2}.$$

Here, $r_A$ and $r_B$ are respectively the radius distance of the first location near the center of the diaphragm for the two curve trenches as shown in FIG. 4A, while $r_C$ and $r_D$ are respectively the radius distance of the second location near the boundary of the diaphragm for the two curve trenches as shown in FIG. 4A. In some embodiments, each of the curve trenches on the diaphragm 100 is identical in shape, and for the two curve trenches as identified in the figure, $r_C=r_D$ and $r_A=r_B$. In some embodiments, however, some of the curve trenches on the diaphragm 100 can have different shapes.

Figure 5A:
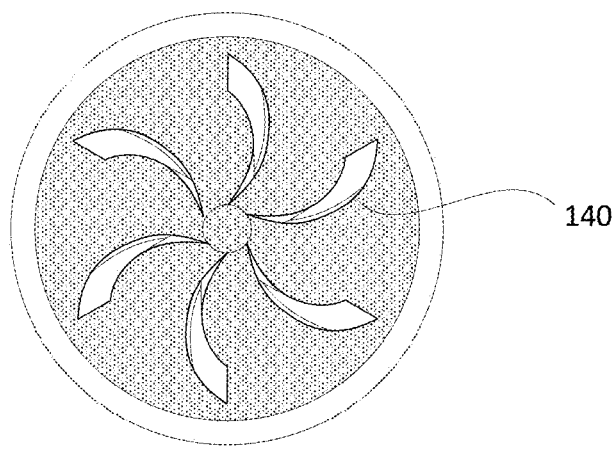
FIGS. 5A-5B are schematic drawings illustrating different possible structures of a curve trench on the diaphragm in accordance with some embodiments.
Figure 5B:
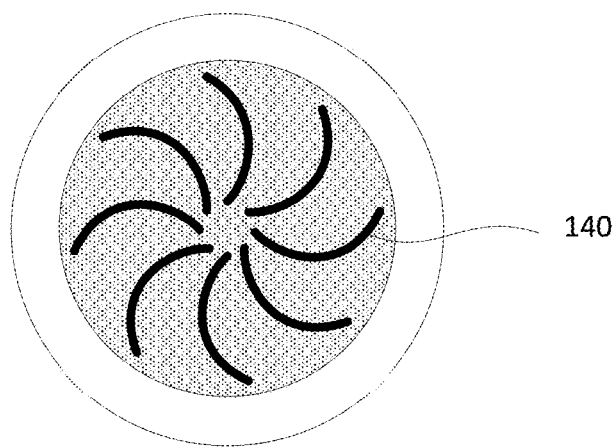

FIGS. 5A-5B are schematic drawings illustrating different possible structures of a curve trench on the diaphragm in accordance with some embodiments. In some embodiments, as shown in FIG. 5A, a curve trench 140 can have a width that changes with its location on the curve trench. In some embodiments, as shown in FIG. 5B, a curve trench 140 can have a uniform width.

Figure 6A:
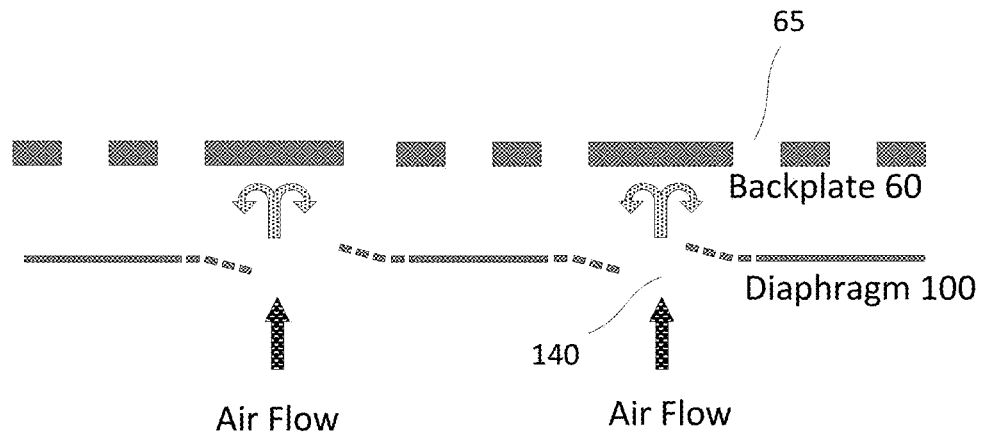
FIGS. 6A-6B are schematic drawings illustrating different possible alignments between the vent valves on the diaphragm and the backplate in accordance with some embodiments.
Figure 6B:
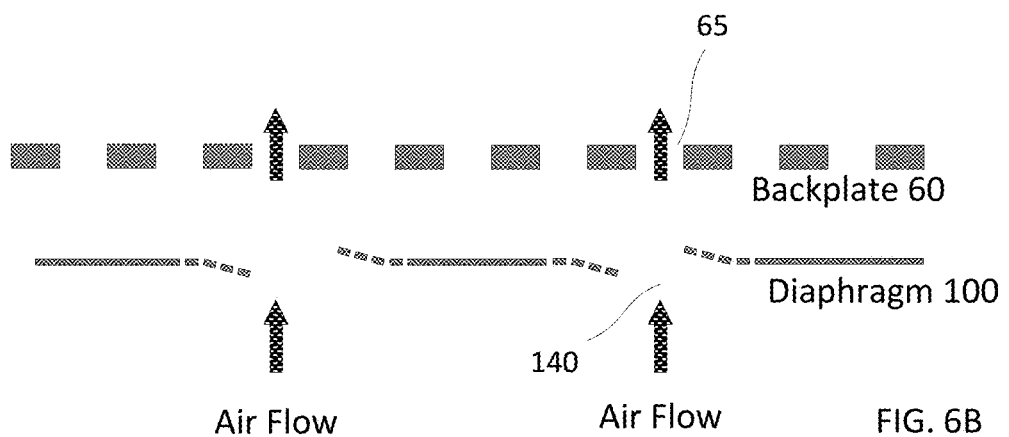

FIGS. 6A-6B are schematic drawings illustrating different possible alignments between the vent valves on the diaphragm 100 and the backplate 60 in accordance with some embodiments. In some embodiments, as shown in FIG. 6A, a vent valve can be placed behind a non-open area in the backplate 60. In FIG. 6A, the air flow passing through the vent valve is blocked by the non-open area in the backplate 60. In some embodiments, as shown in FIG. 6B, a vent valve can be placed behind an open area in the backplate 60. In FIG. 6B, the air flow passing through the vent valve can directly pass through the open area in the backplate 60.

Figure 7A:
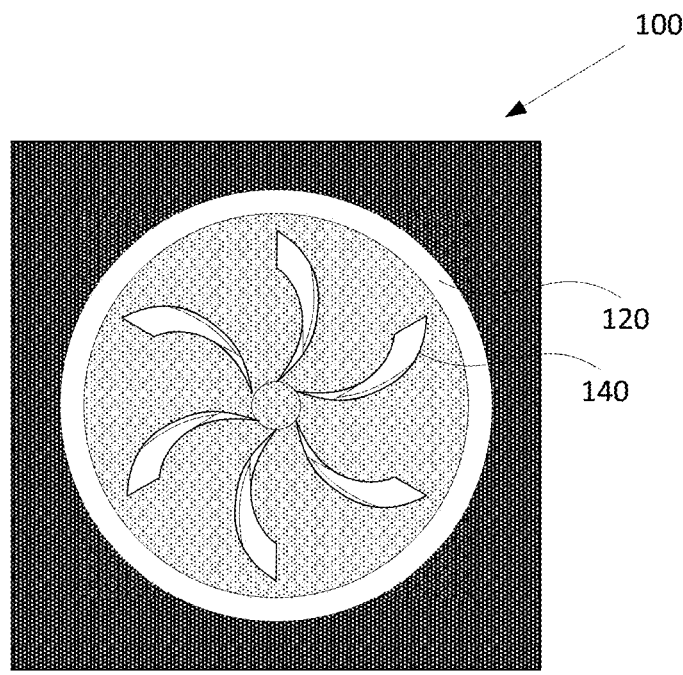
FIGS. 7A-7B are schematic drawings illustrating the deflection of the vortex vent valve under different test conditions in accordance with some embodiments.
Figure 7A:
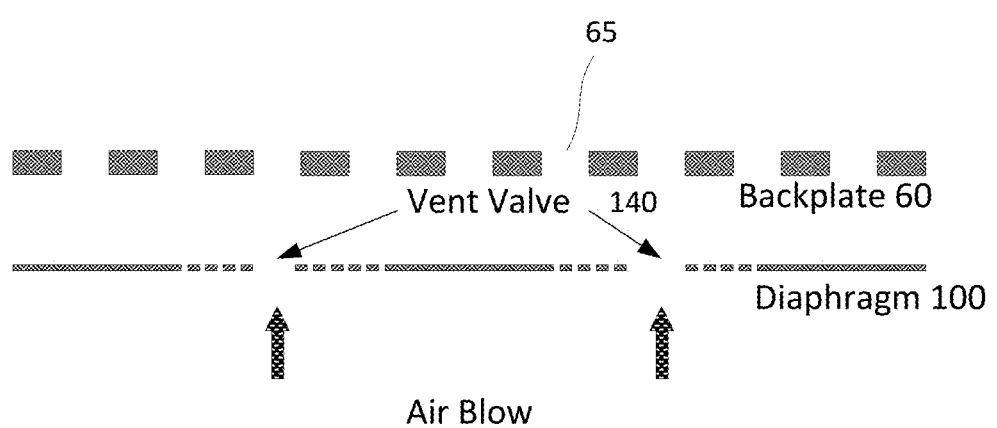
Figure 7B:
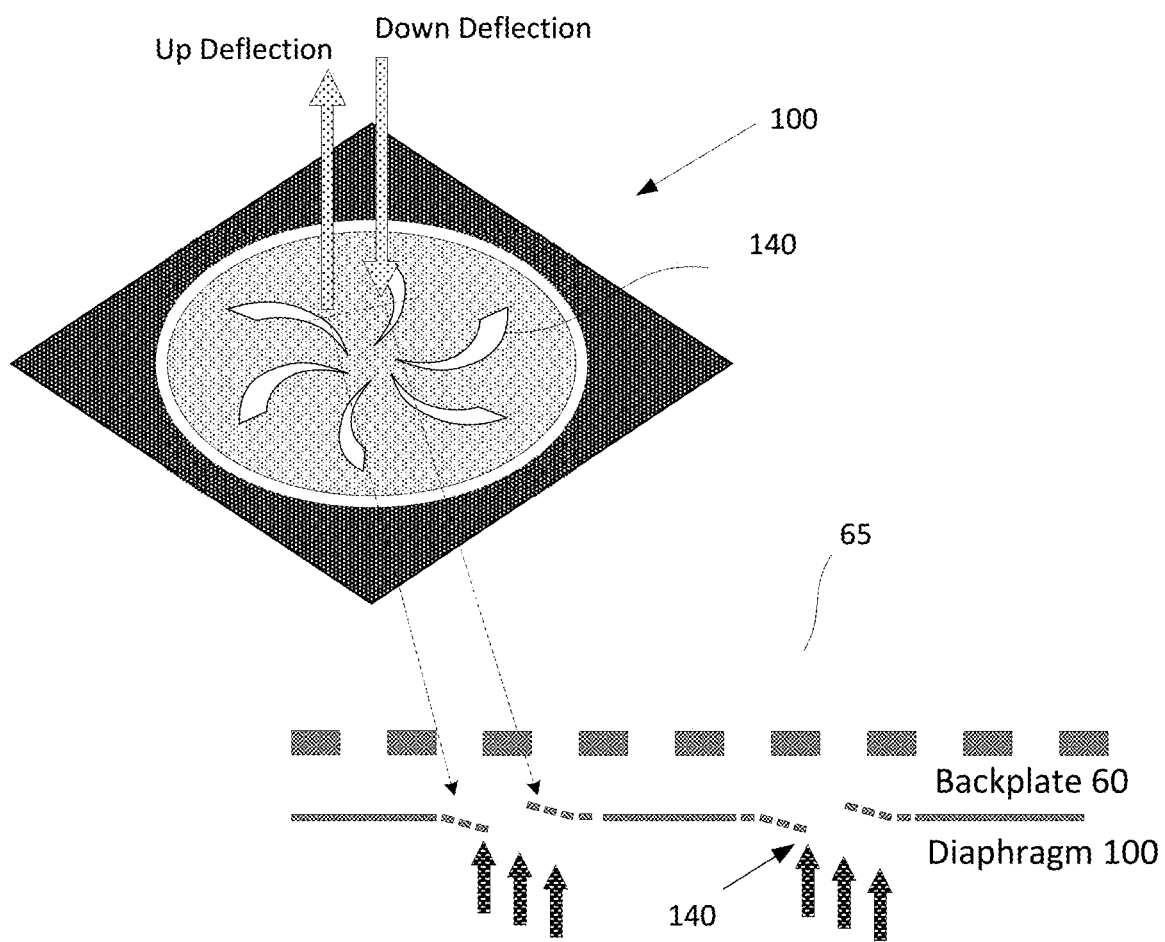

The diaphragm 100 having vortex vent valves can also be designed to pass some common air blow test. FIGS. 7A-7B are schematic drawings illustrating the deflection of the vortex vent valve under different test conditions in accordance with some embodiments. The lower figure in FIG. 7A is a top view of the diaphragm 100 while the lower figure in FIG. 7A is a side view of the diaphragm 100. In some embodiments, as shown in the lower figure in FIG. 7A, when the air blow pressure is much smaller than 0.2 MPa, the vortex vent valve 140 essentially does not move much (as indicated by the dashed line near the vent value), and deflection of the vortex vent valve 140 can be made smaller than 0.1 µm. In some embodiments, as shown in FIG. 7B, when the air blow pressure is much larger than 0.2 MPa, deflection of the vortex vent valve 140 can be made larger than 0.5 µm. Additionally, as shown in FIG. 7B, one side of the the vortex vent valve 140 can have an up deflection while the other side of the the vortex vent valve 140 can have a down deflection.

FIGS. 8A-8I are cross-sectional views showing a method of manufacturing a MEMS microphone 90 that has a diaphragm 100 with vent valves in accordance with some embodiments.

Figure 8A:
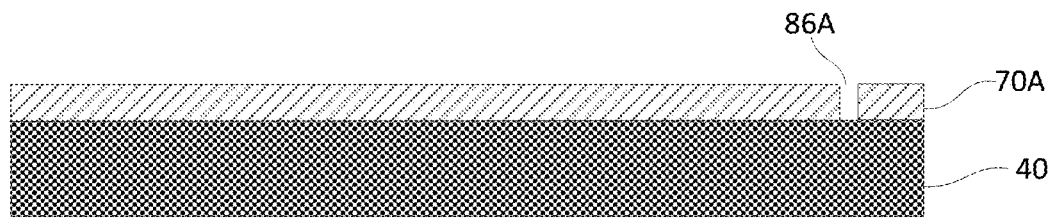
FIGS. 8A-8I are cross-sectional views showing a method of manufacturing a MEMS microphone that has a diaphragm with vent valves in accordance with some embodiments.

As shown in a cross-sectional view in FIG. 8A, a substrate 40 is provided. In various embodiments, the substrate 40 can be, for example, silicon, glass, silicon dioxide, aluminum oxide, or the like. A first oxide layer 70A is formed on the substrate 40. The first oxide layer 70A can be an oxide material (e.g., SiO2). The first oxide layer 70A can be formed by way of a thermal process. In other embodiments, the first oxide layer 70A can be formed by a deposition process, such as, chemical vapor deposition (CVD), physical vapor deposition (PVD), or atomic layer deposition (ALD).

After forming the first oxide layer 70A, the first oxide layer 70A is etched according to a first masking layer (not shown) to form a plurality of via holes, such as, a via hole 86A as shown in FIG. 8A. In some embodiments, the first masking layer can include photoresist or a nitride (e.g., $Si_3N_4$) patterned using a photolithography process. In some embodiments, the etchant can include a dry etchant have an etching chemistry comprising a fluorine species (e.g., $CF_4$, $CHF_3$, $C_4F_8$, etc.). In some embodiments, the etchant can include a wet etchant, such as, hydrofluoric acid (HF), Buffered Oxide Etch (BOE) solution (6 parts 40% $NH_4F$ and 1 part 49% HF), or Tetramethylammonium hydroxide (TMAH).

Figure 8B:
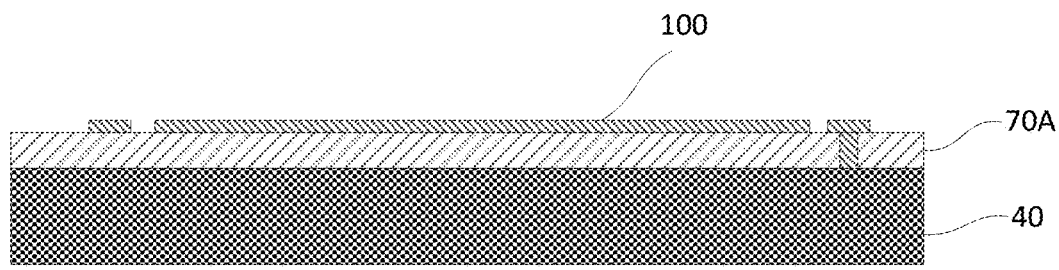

In the next step, as shown in FIG. 8B, a layer of poly-silicon is deposited on top of the first oxide layer 70A with a suitable technique, such as chemical vapor deposition (CVD). After the deposition process, this layer of poly-silicon is subject to a polish process, such as chemical mechanical polishing (CMP) process, for planarization. Then, this layer of poly-silicon is etched according to a second masking layer (not shown) to form a diaphragm 100 including multiple vent valves. In some embodiments, at least one of the vent valves includes a part that is configured to deflect under air pressure when the air pressure is larger than a predetermined value. In some embodiments, the diaphragm 100 formed during the etching process can have multiple wing vent valves, such as, the wing vent valve 130 as shown in FIG. 2A. In some embodiments, the diaphragm 100 formed during the etching process can have multiple vortex vent valves, such as, the vortex vent valve 140 as shown in FIG. 4A.

Figure 8C:
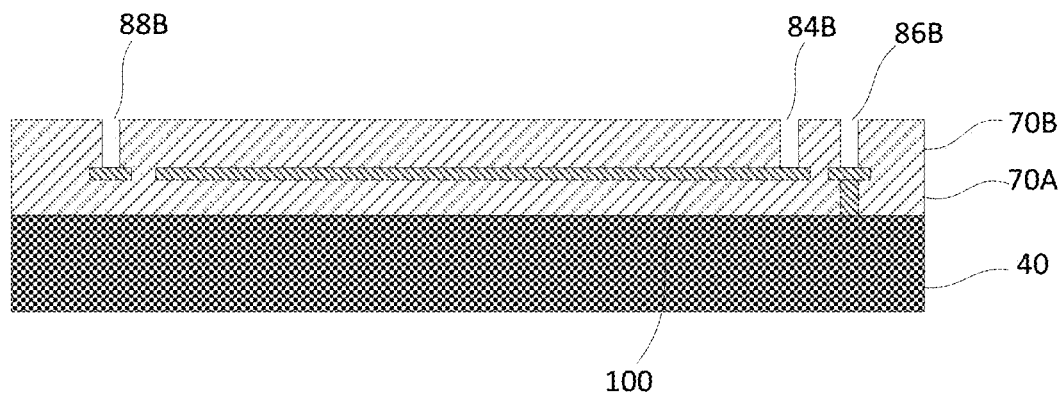

In the next step, as shown in FIG. 8C, a second oxide layer 70B is deposited on top of the diaphragm 100 with a suitable technique, such as chemical vapor deposition (CVD). Many of the techniques for depositing the first oxide layer 70A as described previously can also be used for depositing the second oxide layer 70B. After the deposition process, this second oxide layer 70B is subject to a polish process, such as chemical mechanical polishing (CMP) process, for planarization. Then, this second oxide layer 70B is etched according to a third masking layer (not shown) to form via holes (e.g., via holes 84B, 86B, and 88B).

Figure 8D:
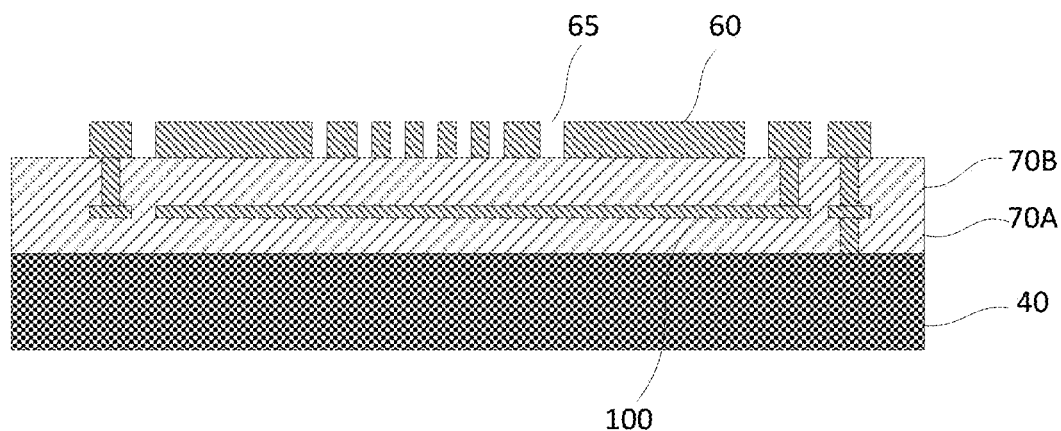

In the next step, as shown in FIG. 8D, a backplate layer is deposited on top of the second oxide layer 70B with a suitable technique. In some embodiments, the backplate layer is formed by depositing a layer of poly-silicon with a suitable technique, such as chemical vapor deposition (CVD). In some embodiments, the backplate layer includes three layers which are formed by first depositing a layer of silicon nitride, continued by depositing a layer of poly-silicon, and followed by depositing another layer of silicon nitride. Each of these three layers can be formed with chemical vapor deposition (CVD), or any other suitable techniques. After the deposition of the backplate layer, this backplate layer is subject to a polish process, such as chemical mechanical polishing (CMP) process, for planarization. Then, this backplate layer is etched according to a fourth masking layer (not shown) to form a backplate 60 including multiple open areas 65.

Figure 8E:
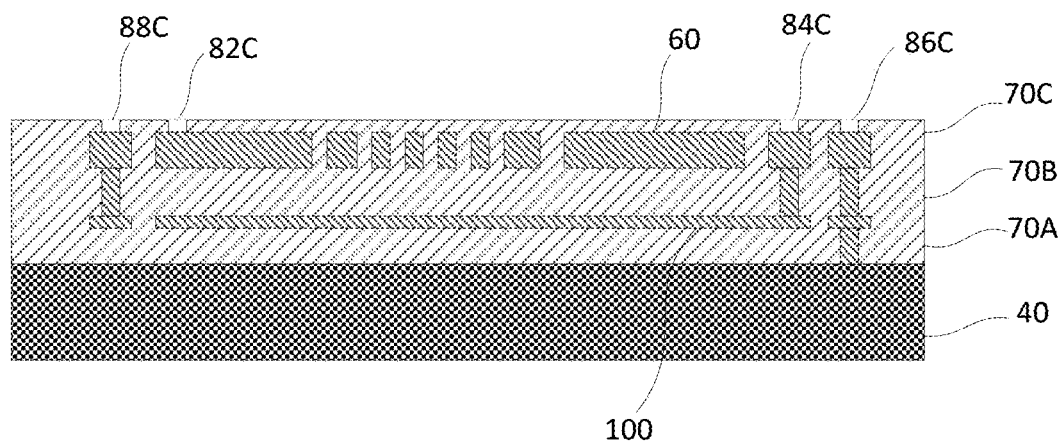

In the next step, as shown in FIG. 8E, a third oxide layer 70C is deposited on top of the backplate layer including the backplate 60. Many of the techniques for depositing the first oxide layer 70A as described previously can also be used for depositing the third oxide layer 70C. After the deposition process, this third oxide layer 70C is subject to a polish process, such as chemical mechanical polishing (CMP) process, for planarization. Then, this third oxide layer 70C is etched according to a fifth masking layer (not shown) to form via holes (e.g., via holes 82C, 84C, 86C, and 88C).

Figure 8F:
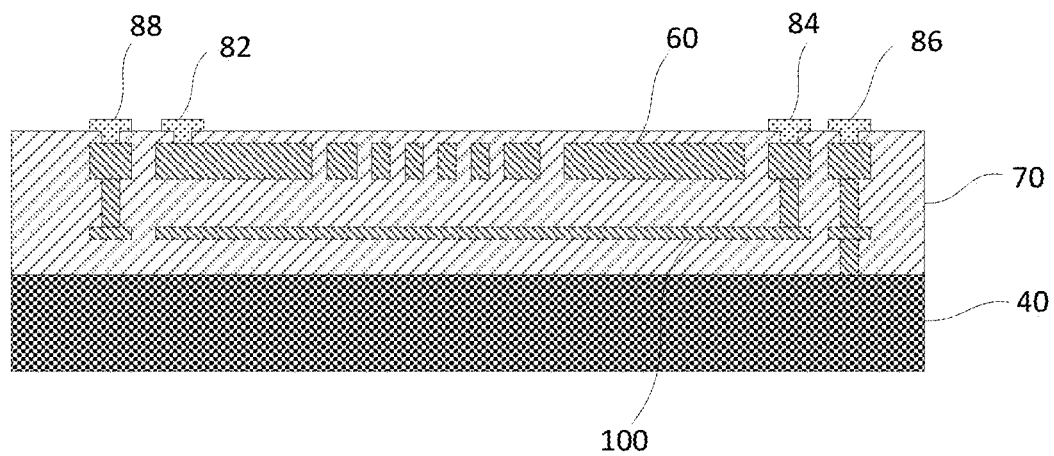

In the next step, as shown in FIG. 8F, a metal contact layer is deposited on top of the third oxide layer 70C. This metal contact layer is etched according to a sixth masking layer (not shown) to form metal contacts (e.g., metal contacts 82, 84, 86, and 88). Examples of the materials for forming the metal contacts include silver, gold, copper, aluminum, aluminum-copper alloy, gold-copper alloy or other suitable conductive materials. In FIG. 8F, the first oxide layer 70A, the second oxide layer 70B, and the third oxide layer 70C collectively form an oxide layer 70 that provide electrical isolation and mechanical supports for various components on the substrate 40.

Figure 8G:
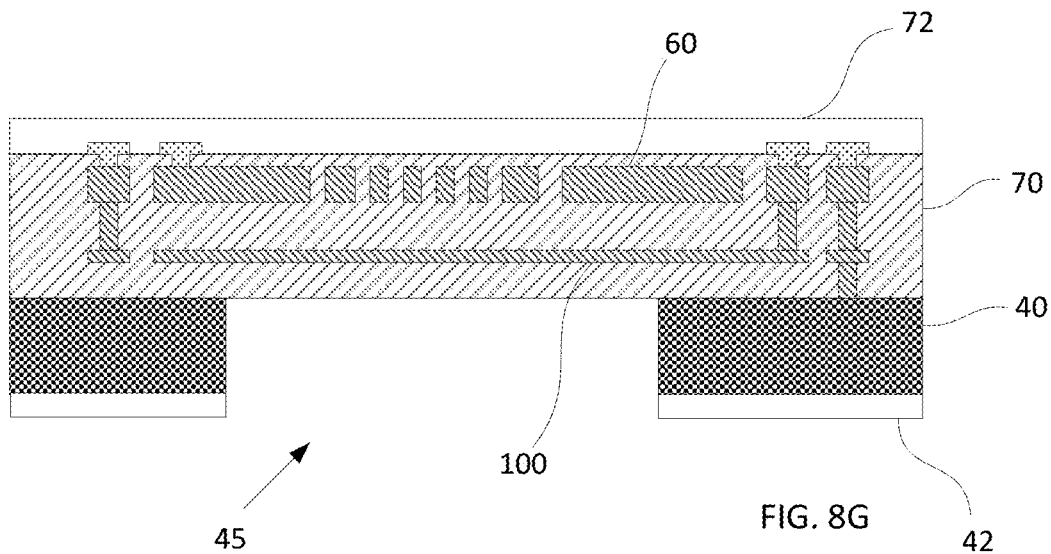

In the next step, as shown in FIG. 8G, a first protection layer 72 is deposited on the oxide layer 70 and on the metal contacts, and a second protection layer 42 is deposited on the substrate 40. Example protection layers for the first protection layer 72 and the second protection layer 42 include a photoresists layer or a dielectric material layer (e.g., silicon nitride). Some areas of the second protection layer 42 are removed to form a protection mask on the substrate 40 that opens up selected parts of the substrate 40 for an etching process. Next, the substrate 40 is etched according to the protection mask formed by the second protection layer 42 to create an opening 45 on the substrate 40. In some embodiments, the opening 45 on the substrate 40 can be opened up by anisotropic plasma etching.

Figure 8H:
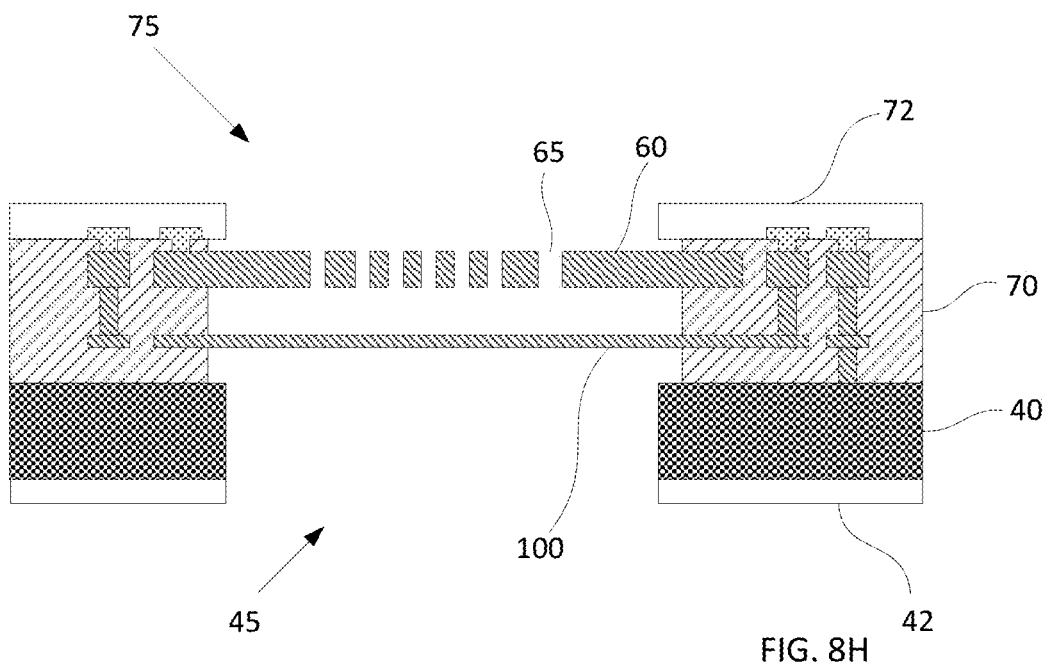

In the next step, as shown in FIG. 8H, some areas of the first protection layer 72 are removed to form a protection mask on the oxide layer 70 and on the metal contacts. This protection mask formed by the first protection layer 72 opens up an opening 75 exposing the oxide layer 70 for an etching process. Next, the oxide layer 70 is etched with a wet etchant, starting from both the opening 45 on the substrate 40 and the opening 75 on the oxide layer 70, to form the suspended diaphragm 100 and the suspended backplate 60. Examples of the wet etchant that can be used for etching the oxide layer 70 include hydrofluoric acid (HF), Buffered Oxide Etch (BOE) solution (6 parts 40% $NH_4F$ and 1 part 49% HF), or Tetramethylammonium hydroxide (TMAH)).

Figure 8I:
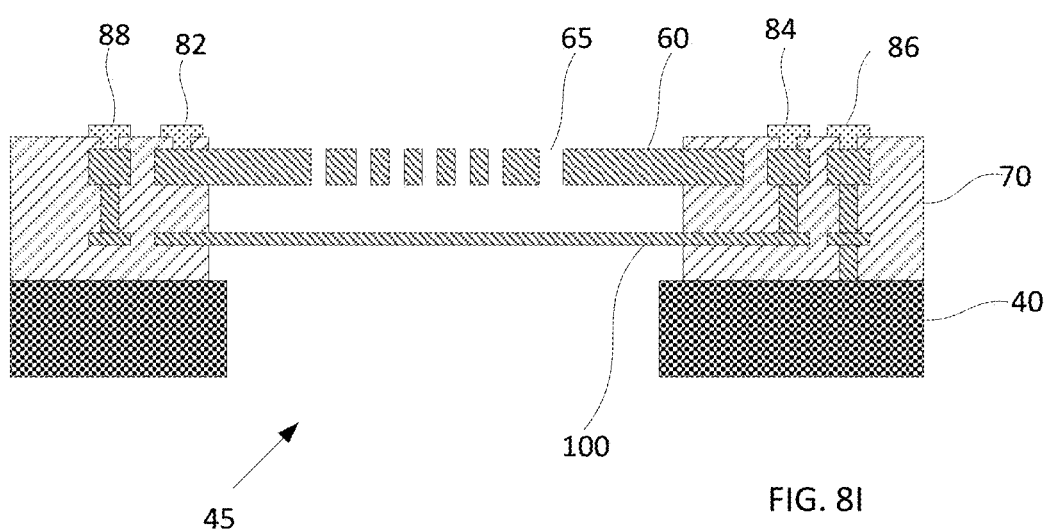

In the next step, as shown in FIG. 8I, both the first protection layer 72 and the second protection layer 42 are removed. These protection layers can be stripped off with chemicals or etched away with etchant. After removing these protection layers, the MEMS microphone 90 having the diaphragm 100 with vent valves is fabricated.

In FIG. 8I, the MEMS microphone 90 as fabricated includes an electrical contact 82 electrically connected to the backplate 60 that forms a first terminal for the capacitive element, and an electrical contact 84 electrically connected to the diaphragm 50 that forms a second terminal for the capacitive element. In addition, the MEMS microphone 90 can include one or more contacts (e.g., a contact 86, the only one shown in the figure) that connect to pre-fabricated CMOS circuits (not shown in the figure) on the substrate through via holes. The pre-fabricated CMOS circuits can provide the electronics for supporting the operation of the MEMS microphone 90. In some embodiments, the prefabricated CMOS circuits can be fabricated, using suitable process, on the substrate 40 before the first oxide layer 70A is formed on the substrate 40 (as shown in FIG. 8A). Furthermore, the MEMS microphone 90 can include a contact 88, passing through a via hole, that connects to an electronic component in the conducting layer for constructing the diaphragm 100, to provide an electronic grounding if needed.

Some aspects of the present disclosure relate to a microphone. The microphone includes a backplate that has a plurality of open areas, and a diaphragm spaced apart from the backplate. The diaphragm is deformable by sound waves to cause gaps between the backplate and the diaphragm being changed at multiple locations on the diaphragm. The diaphragm includes a plurality of anchor areas, located near a boundary of the diaphragm, which is fixed relative to the backplate. The diaphragm also includes a sector with its arc located between neighboring anchor areas. The sector includes a wing vent valve. The wing vent valve includes a first vent slot extending along a first radius, a second vent slot extending along a second radius, and a third vent slot joining the first vent slot and the second vent slot.

Other aspects of the present disclosure relate to a microphone. The microphone includes a backplate that has a plurality of open areas, and a diaphragm spaced apart from the backplate. The diaphragm is deformable by sound waves to cause gaps between the backplate and the diaphragm being changed at multiple locations on the diaphragm. The diaphragm includes one or more anchor areas, located near a boundary of the diaphragm, which is fixed relative to the backplate. The diaphragm includes a plurality of curve trenches. Each curve trench extending from a first location near a center of the diaphragm to a second location near the boundary of the diaphragm. A first linear distance between two curve trenches at the first location near the center of the diaphragm is smaller than a second linear distance between the two curve trenches at the second location near the boundary of the diaphragm.

Still other aspects of the present disclosure relate to a method of manufacturing a microphone. A first layer of conducting material is formed on a first layer of insulating material supported by a substrate. A first pattern in a diaphragm is formed in the first layer of conducting material, and this pattern includes multiple vent valves. A second layer of conducting material is formed on a second layer of insulating material supported by the first layer of conducting material. A second pattern in a backplate is formed in the second layer of conducting material, and this pattern includes multiple open areas. The substrate is etched according to a first protection mask formed on the substrate to create a first opening in the substrate. A second opening is created in a second protection mask formed on a third layer of insulating material supported by the second layer of conducting material. The first layer of insulating material, the second layer of insulating material, and the third layer of insulating material are etched to create a capacitive structure that includes parts of the diaphragm and the backplate being suspended in air.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a microphone, the method comprising:
    forming a first layer of conducting material on a first layer of insulating material supported by a substrate;
    forming a first pattern in a diaphragm, in the first layer of conducting material, that includes multiple vent valves;
    forming a second layer of conducting material on a second layer of insulating material supported by the first layer of conducting material;
    forming a second pattern in a backplate, in the second layer of conducting material, that includes multiple open areas;
    etching the substrate according to a first protection mask formed on the substrate to create a first opening in the substrate;
    creating a second opening in another protection mask formed on a third layer of insulating material supported by the second layer of conducting material; and
    etching the first layer of insulating material, the second layer of insulating material, and the third layer of insulating material, to create a capacitive structure that includes parts of the diaphragm and the backplate being suspended in air.

2. The method of claim 1, wherein at least one of the vent valves is a wing vent valve.

3. The method of claim 1, wherein at least one of the vent valves is a vortex vent valve.

4. The method of claim 1, wherein at least one of the vent valves includes a part that is configured to deflect under air pressure when the air pressure is larger than a predetermined value.

5. The method of claim 1, wherein a wing vent valve structure includes a curve trench extending from a first location near a center of the diaphragm to a second location near an outer edge of the diaphragm, and wherein the curve trench has a width thereof changing from the first location to the second location.

6. The method of claim 1, wherein at least one of the vent valves includes a first vent slot extending along a first radius of the diaphragm, a second vent slot extending along a second radius of the diaphragm, and a third vent slot joining the first vent slot and the second vent slot, wherein the first vent slot and the second vent slot each have a length that is less than one fourth of a radius length of the diaphragm from a center of the diaphragm to an outer edge of the diaphragm.

7. The method of claim 1:
    wherein at least one of the vent valves includes a plurality of curve trenches, a curve trench extending from a first location near a center of the diaphragm to a second location near a boundary of the diaphragm, and
    wherein the curve trench has a width thereof changing with its location at the curve trench.

8. The method of claim 1, wherein the diaphragm comprises poly-silicon material and wherein the backplate comprises poly-silicon material.

9. A method, comprising:
    forming a first layer of insulating material over a substrate;

forming a first layer of conducting material over the first layer of insulating material, and patterning multiple vent valve structures in the first layer of conducting material;

forming a second layer of insulating material over the first layer of conducting material and over the multiple vent valve structures;

forming a second layer of conducting material over the second layer of insulating material, and forming multiple open areas in the second layer of conducting material;

forming a third layer of insulating material over the second layer of conducting material; and forming an opening in the substrate to expose a lower surface of the first layer of insulating material;

concurrently etching the first layer of insulating material, the second layer of insulating material, and the third layer of insulating material, to suspend a diaphragm portion of the first layer of conducting material and a backplate portion of the second layer of conducting material in air.

10. The method of claim 9, wherein concurrently etching the first layer of insulating material, the second layer of insulating material, and the third layer of insulating material includes an etch comprising: hydrofluoric acid (HF), Buffered Oxide Etch (BOE) solution (6 parts 40% $NH_4F$ and 1 part 49% HF), or Tetramethylammonium hydroxide (TMAH).

11. The method of claim 9, wherein the diaphragm portion comprises poly-silicon material.

12. The method of claim 9, wherein the backplate portion comprises a layer of poly-silicon material.

13. The method of claim 9, wherein at least one of the multiple vent valve structures includes a curve trench extending from a first location near a center of the diaphragm portion to a second location near an outer edge of the diaphragm portion, and wherein the curve trench has a width thereof changing from the first location to the second location.

14. The method of claim 9, wherein at least one of the multiple vent valve structures includes a first vent slot extending along a first radius of the diaphragm portion, a second vent slot extending along a second radius of the diaphragm portion, and a third vent slot joining the first vent slot and the second vent slot, wherein the first vent slot and the second vent slot each have a length that is less than one fourth of a radius length of the diaphragm portion from a center of the diaphragm portion to an outer edge of the diaphragm portion.

15. The method of claim 9:
wherein at least one of the multiple vent valve structures includes a plurality of curve trenches, each curve trench extending from a first location near a center of the diaphragm portion to a second location near a boundary of the diaphragm portion, and
wherein at least one curve trench has a width thereof changing with its location at the at least one curve trench.

16. The method of claim 9, wherein prior to the concurrent etching of the first layer of insulating material, the second layer of insulating material, and the third layer of insulating material, the multiple vent valve structures are fixed; but after the concurrent etching of the first layer of insulating material, the second layer of insulating material, and the third layer of insulating material, the multiple vent valve structures each include a part that is configured to deflect under an air pressure difference between an upper surface of the part and the lower surface of the part when the air pressure difference is larger than a predetermined value.

17. A method, comprising:
forming a first layer of insulating material over a substrate;
forming a first layer of conducting material over the first layer of insulating material, and patterning the first layer of conducting material to establish a diaphragm structure that includes multiple wing vent valve structures; and
wherein a wing vent valve structure of the multiple wing vent valve structures includes a curve trench extending from a first location near a center of the diaphragm structure to a second location near an outer edge of the diaphragm structure, and wherein the curve trench has a width thereof changing from the first location to the second location; or
wherein a wing vent valve structure of the multiple wing vent valve structures includes a first vent slot extending along a first radius of the diaphragm structure, a second vent slot extending along a second radius of the diaphragm structure, and a third vent slot joining the first vent slot and the second vent slot, wherein the first vent slot and the second vent slot each have a length that is less than one fourth of a radius length of the diaphragm structure from the center of the diaphragm structure to the outer edge of the diaphragm structure.

18. The method of claim 17, wherein the diaphragm structure comprises poly-silicon material.

19. The method of claim 17, further comprising:
forming a second layer of insulating material over the first layer of conductive material;
forming a second layer of conductive material over the second layer of insulating material; and
forming a third layer of insulating material over the second layer of conductive material.

20. The method of claim 19, further comprising:
performing in situ etching of the first layer of insulating material, the second layer of insulating material, and the third layer of insulating material, to suspend the diaphragm structure in air.

* * * * *